(12) United States Patent
Ma et al.

(10) Patent No.: US 11,349,108 B2
(45) Date of Patent: May 31, 2022

(54) ARRAY SUBSTRATE AND MANUFACTURING METHOD THEREOF, AND DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventors: Weixin Ma, Hubei (CN); Caiqin Chen, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 65 days.

(21) Appl. No.: 16/769,306

(22) PCT Filed: Nov. 4, 2019

(86) PCT No.: PCT/CN2019/115346
§ 371 (c)(1),
(2) Date: Jun. 3, 2020

(87) PCT Pub. No.: WO2021/031358
PCT Pub. Date: Feb. 25, 2021

(65) Prior Publication Data
US 2021/0083232 A1    Mar. 18, 2021

(30) Foreign Application Priority Data
Aug. 19, 2019 (CN) .......................... 201910766043.3

(51) Int. Cl.
H01L 51/56 (2006.01)
H01L 27/32 (2006.01)
H01L 51/00 (2006.01)

(52) U.S. Cl.
CPC .......... *H01L 51/56* (2013.01); *H01L 27/3244* (2013.01); *H01L 51/0021* (2013.01); *H01L 51/0097* (2013.01); *H01L 2227/323* (2013.01)

(58) Field of Classification Search
None
See application file for complete search history.

(56) References Cited

U.S. PATENT DOCUMENTS 10,852,863 B2 * 12/2020 Hong .................... G06F 3/041
2018/0342707 A1 * 11/2018 Lee ..................... H01L 27/3258
(Continued)

FOREIGN PATENT DOCUMENTS

| CN | 107658333 A | 2/2018 |
| CN | 108550612 A | 9/2018 |
| CN | 109659322 A | 4/2019 |

*Primary Examiner* — J. E. Schoenholtz
(74) *Attorney, Agent, or Firm* — Hamre, Schumann, Mueller & Larson, P.C.

(57) ABSTRACT

The present invention provides an array substrate and a manufacturing method thereof, and a display panel. The manufacturing method of the array substrate includes following steps of: providing a base, wherein the base comprises a non-display region; forming an inorganic film set layer on the base; forming an opening on the inorganic film set layer and forming a patterned source-drain layer, wherein the opening is disposed in the non-display region, and the source-drain layer does not cover or fill the opening; and forming an organic planarization layer on the inorganic film set layer, wherein the organic planarization layer covers the source-drain layer and fills and covers the opening.

12 Claims, 9 Drawing Sheets

(56) References Cited

U.S. PATENT DOCUMENTS

| | | | |
|---|---|---|---|
| 2019/0012031 A1* | 1/2019 | Kim | H01L 51/5203 |
| 2019/0019966 A1* | 1/2019 | Jiang | H01L 51/0097 |
| 2019/0131368 A1 | 5/2019 | Zhang et al. | |
| 2019/0164995 A1* | 5/2019 | Lee | H01L 27/3276 |
| 2019/0324567 A1* | 10/2019 | Hong | G06F 3/0446 |
| 2020/0243574 A1* | 7/2020 | Tian | H01L 27/1262 |

* cited by examiner

ARRAY SUBSTRATE AND MANUFACTURING METHOD THEREOF, AND DISPLAY PANEL

FIELD OF INVENTION

The present invention relates to the field of display technologies, and in particular, to an array substrate, a manufacturing method thereof, and a display panel.

BACKGROUND OF INVENTION

Active-matrix organic light emitting diode (AMOLED) panels have become a new generation display technology due to their high contrast, wide color gamut, low power consumption, and foldability.

At present, a flexible AMOLED array substrate process includes ten to twelve processes, which is two to three more processes than a rigid AMOLED array substrate process. Among them, the extra processes mainly used to etch and dig an inorganic film layer which has poor stress on a non-display bending zone and has poor flexibility, and is filled with an organic material with good flexibility to improve bending performance of the non-display bend zone.

However, the above array process of the flexible AMOLED has problems of many process steps and high cost.

SUMMARY OF THE INVENTION

An object of the present invention is to provide an array substrate, a manufacturing method thereof, and a display panel to reduce processes of the array substrate and reduce a cost.

In order to solve the above problem, an embodiment of the present invention provides a manufacturing method of an array substrate. The manufacturing method of the array substrate, comprising following steps of: providing a base, wherein the base comprises a display region and a non-display region disposed around the display region; forming an inorganic film set layer on the base; forming an opening on the inorganic film set layer and forming a patterned source-drain layer, wherein the opening is disposed in the non-display region, and the source-drain layer does not cover or fill the opening; and forming an organic planarization layer on the inorganic film set layer, wherein the organic planarization layer covers the source-drain layer and fills and covers the opening.

Wherein the step of forming the opening on the inorganic film set layer and forming the patterned source-drain layer comprises: forming the patterned source-drain layer on the inorganic film set layer; and forming the opening in a region of the inorganic film set layer not covered by the source-drain layer, wherein the opening is disposed in the non-display region.

Wherein the opening comprises a first hole and a second hole that are stacked and communicated with each other on the base, and the step of forming the opening on the inorganic film set layer comprises: forming the first hole having a first predetermined depth on the inorganic film set layer by exposure and etching; and forming the second hole having a second predetermined depth on the inorganic film set layer in a direction close to the base and through the first hole by exposure and etching, wherein a sum of the second predetermined depth and the first predetermined depth is equal to a thickness of the inorganic film set layer.

Wherein the inorganic film set layer comprises a buffer layer, a first gate insulating layer, a second gate insulating layer, and an interlayer dielectric layer sequentially away from the base, and the step of forming the inorganic film set layer on the base comprises: depositing the buffer layer on the base; depositing the first gate insulating layer on the buffer layer; depositing the second gate insulating layer on the first gate insulating layer; and depositing the interlayer dielectric layer on the second gate insulating layer.

Wherein further comprises: forming a low temperature polysilicon layer on the buffer layer after the step of depositing the buffer layer on the base, wherein the low temperature polysilicon layer is disposed in the display region, and the first gate insulating layer covers the low temperature polysilicon layer; forming a first metal layer on the first gate insulating layer after the step of depositing the first gate insulating layer on the buffer layer, wherein the first metal layer is disposed in the display region, and the second gate insulating layer covers the first metal layer; and forming a second metal layer on the second gate insulating layer after the step of depositing the second gate insulating layer on the first gate insulating layer, wherein the second metal layer is disposed in the display region, and the interlayer dielectric layer covers the second metal layer.

In order to solve the above problem, an embodiment of the present invention further provides an array substrate. The array substrate comprises: a base, wherein the base comprises a display region and a non-display region disposed around the display region; an inorganic film set layer disposed on the base, wherein an opening is provided on the inorganic film set layer, and the opening is disposed in the non-display region; a patterned source-drain layer disposed on the inorganic film set layer, wherein the source-drain layer does not cover or fill the opening; and an organic planarization layer disposed on the inorganic film set layer, wherein the organic planarization layer covers the source-drain layer and fills and covers the opening.

Wherein the non-display region comprises a bending zone and a non-bending zone disposed at a side of the bending zone, and the opening is disposed in the bending zone and is plural.

Wherein the plurality of openings is arranged in an array on the bending zone.

Wherein the opening is a groove or a through hole.

Wherein the inorganic film set layer comprises a buffer layer, a first gate insulating layer, a second gate insulating layer, and an interlayer dielectric layer sequentially away from the base.

Wherein the opening comprises a first hole and a second hole that are stacked and communicated with each other on the base.

Wherein the first hole is disposed on the second hole, and a ratio of a depth of the first hole to a thickness of the inorganic film set layer is in a range from 0.3 to 0.5.

In order to solve the above problem, an embodiment of the present invention further provides a display panel. The display panel comprises an array substrate. The array substrate comprises a base, wherein the base comprises a display region and a non-display region disposed around the display region; an inorganic film set layer disposed on the base, wherein an opening is provided on the inorganic film set layer, and the opening is disposed in the non-display region; a patterned source-drain layer disposed on the inorganic film set layer, wherein the source-drain layer does not cover or fill the opening; and an organic planarization layer disposed on the inorganic film set layer, wherein the organic planarization layer covers the source-drain layer and fills and covers the opening.

Wherein the non-display region comprises a bending zone and a non-bending zone disposed at a side of the bending zone, and the opening is disposed in the bending zone and is plural.

Wherein the plurality of openings is arranged in an array on the bending zone.

Wherein the opening is a groove or a through hole.

Wherein the inorganic film set layer comprises a buffer layer, a first gate insulating layer, a second gate insulating layer, and an interlayer dielectric layer sequentially away from the base.

Wherein the opening comprises a first hole and a second hole that are stacked and communicated with each other on the base.

Wherein the first hole is disposed on the second hole, and a ratio of a depth of the first hole to a thickness of the inorganic film set layer is in a range from 0.3 to 0.5.

The beneficial effects of the present invention are: different from the prior art, the manufacturing method of the array substrate provided by the present invention, by making the opening on the inorganic film set layer disposed in the non-display region, and filling the opening in the subsequent planarization layer manufacturing process, which can reduce processes of filling the opening with organic material, saves masks of the processes, and helps to reduce costs.

DESCRIPTION OF DRAWINGS

In order to more clearly illustrate the embodiments or the technical solutions in the prior art, a brief introduction of the drawings used in the embodiments or the prior art description will be briefly described below. Obviously, the drawings in the following description are only some of the embodiments of the invention, and those skilled in the art can obtain other drawings according to the drawings without any creative work.

DETAILED DESCRIPTION OF PREFERRED EMBODIMENTS

The present invention will be further described in detail below with reference to the accompanying drawings and embodiments. In particular, the following examples are only intended to illustrate the invention, but do not limit the scope of the invention. Likewise, the following embodiments are only some of the embodiments of the present invention rather than all of the embodiments. All other embodiments obtained by those of ordinary skill in the art without creative efforts are within the scope of the present invention.

At present, an array process of flexible AMOLEDs has problems of many process steps and high cost. In order to solve above technical problem, a technical solution adopted by the present invention is to provide a manufacturing method of an array substrate to reduce the process of the array substrate and reduce the cost.

Figure 1:
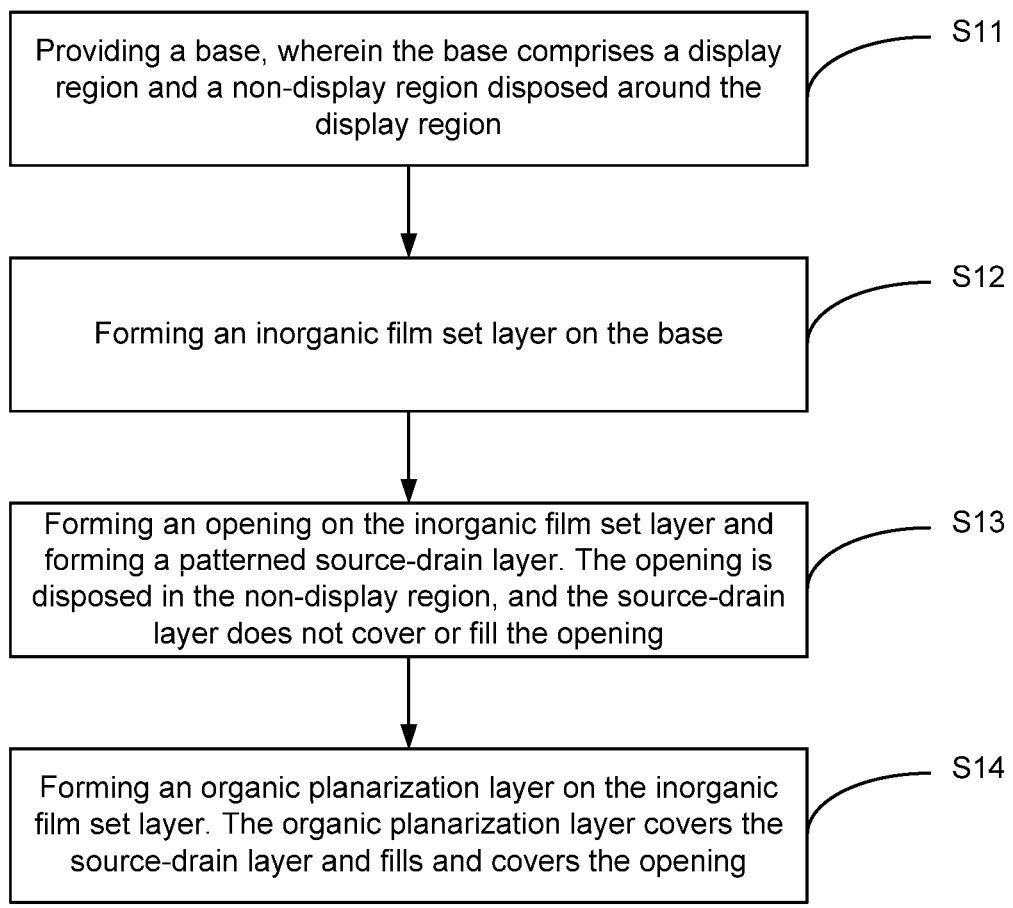
FIG. 1 is a schematic flowchart of a manufacturing method of an array substrate according to an embodiment of the present invention.

Please refer to FIG. 1, which is a schematic flowchart of a manufacturing method of an array substrate according to an embodiment of the present invention. The specific process of the manufacturing method of the array substrate can be as follows:

S11: providing a base, wherein the base comprises a display region and a non-display region disposed around the display region.

Wherein, the substrate is a flexible substrate, and a material thereof may be one of organic polymers such as polyimide, polycarbonate, polyethylene terephthalate, polyethersulfone substrate, and the like.

Figure 2:
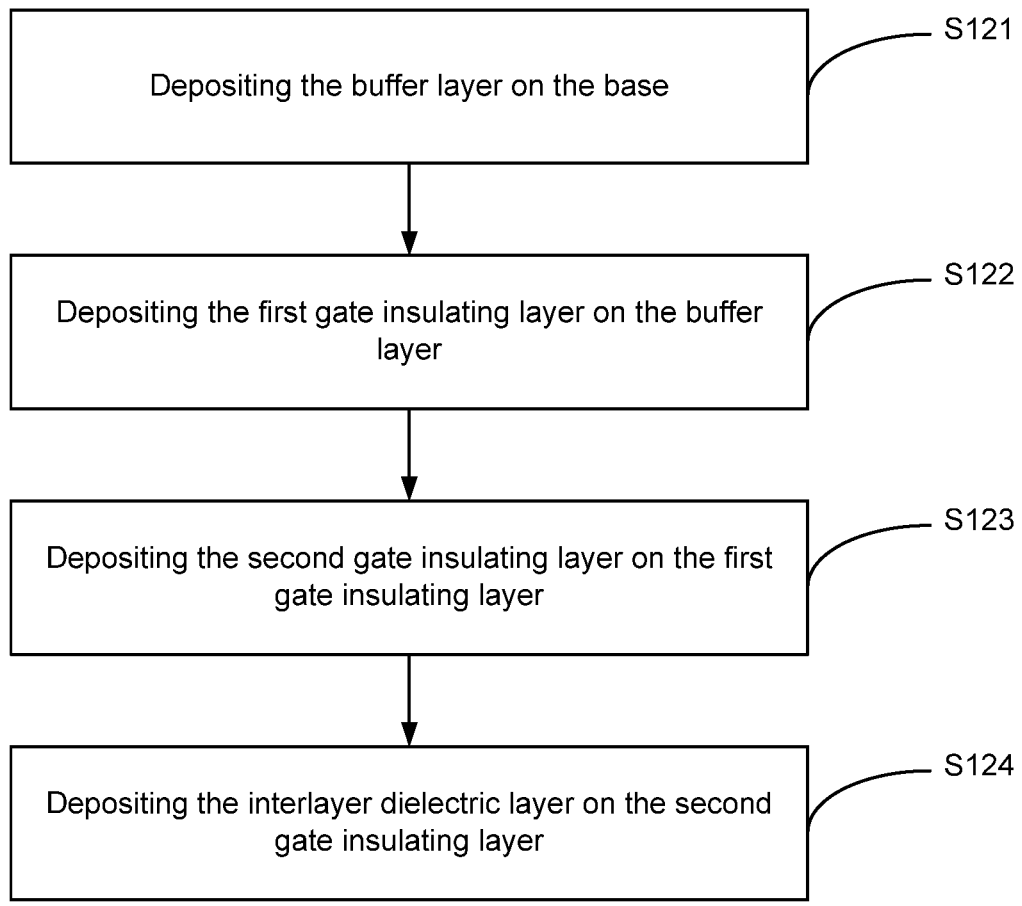
FIG. 2 is a schematic flowchart of S12 in FIG. 1.

S12: forming an inorganic film set layer on the base.

Wherein the inorganic film set layer comprises a buffer layer, a first gate insulating layer, a second gate insulating layer, and an interlayer dielectric layer sequentially away from the base. Specifically, as shown in FIG. 2, S12 may comprise:

S121: depositing the buffer layer on the base.

A material of the buffer layer may be SiNx, SiOx or other suitable materials. For example, S12 may specifically comprise: sequentially forming a silicon nitride layer and a silicon oxide layer on the substrate by using a chemical vapor deposition process.

S122: depositing the first gate insulating layer on the buffer layer.

For example, the first gate insulating layer is formed on the buffer layer by a chemical vapor deposition process. Wherein, a material of the first gate insulating layer may be SiOx.

S123: depositing the second gate insulating layer on the first gate insulating layer.

For example, the second gate insulating layer is formed on the first gate insulating layer by a chemical vapor deposition process. Wherein, a material of the second gate insulating layer may be SiNx.

S124: depositing the interlayer dielectric layer on the second gate insulating layer.

For example, the interlayer dielectric layer is formed on the second gate insulating layer by a chemical vapor deposition process. A material of the interlayer dielectric layer may be one or two of SiNx and SiOx.

In a specific embodiment, after S121 and before S122, it may also comprise:

Step A: forming a low temperature polysilicon layer on the buffer layer. The low temperature polysilicon layer is disposed in the display region, and the first gate insulating layer covers the low temperature polysilicon layer.

For example, step A may specifically comprise: in the display region, an amorphous silicon layer is formed on the buffer layer by a chemical vapor deposition process, and then the amorphous silicon layer is processed by an excimer laser annealing process to form the corresponding low temperature polysilicon layer.

After S122 and before S123, it may also comprise:

Step B: forming a first metal layer on the first gate insulating layer after the step of depositing the first gate insulating layer on the buffer layer. The first metal layer is disposed in the display region, and the second gate insulating layer covers the first metal layer.

Wherein, the first metal layer may be a patterned gate layer, comprising a gate of the thin film transistor in the array substrate, and a lower electrode of a storage capacitor. Specifically, step B may specifically comprise: In the display region, a first metal material layer is laid on the first gate insulating layer by a physical vapor deposition process, and then the first metal material layer is patterned by an exposure and etching process to obtain the patterned gate layer. Wherein, the material of the first metal layer may be molybdenum.

After S123 and before S124, it may also comprise:

Step C: forming a second metal layer on the second gate insulating layer. The second metal layer is disposed in the display region, and the interlayer dielectric layer covers the second metal layer.

Wherein the second metal layer comprises an upper electrode of a storage capacitor in the array substrate, and the upper electrode and the lower electrode of the first metal layer together constitute a storage capacitor in the array substrate. Specifically, step C may specifically comprise: In the display region, a second metal material layer is laid on the second gate insulating layer by a physical vapor deposition process, and then the second metal material layer is patterned by an exposure and etching process to obtain the second metal layer. Wherein, the material of the second metal layer may be molybdenum.

S13: forming an opening on the inorganic film set layer and forming a patterned source-drain layer. The opening is disposed in the non-display region, and the source-drain layer does not cover or fill the opening.

Figure 3:
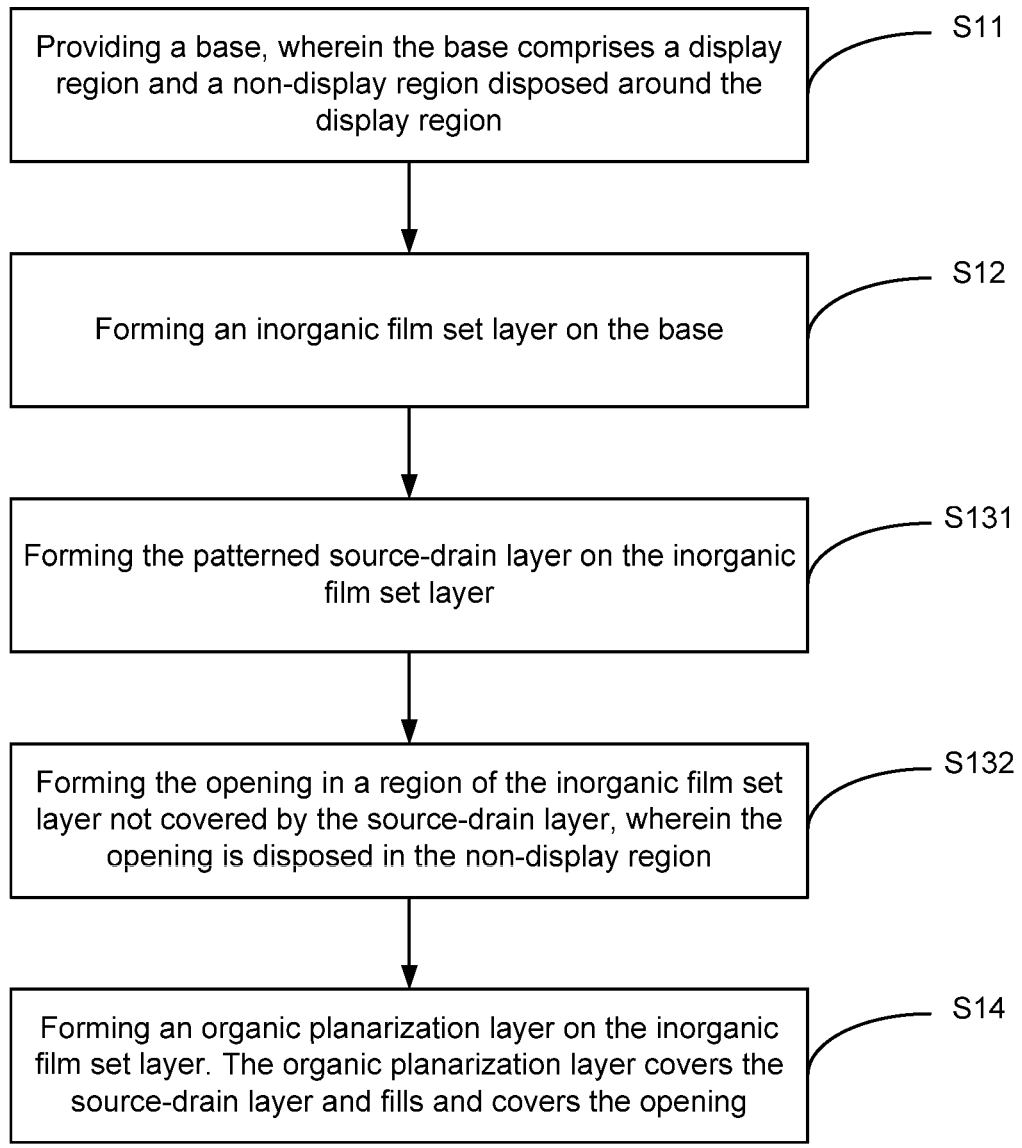
FIG. 3 is another schematic flowchart of the manufacturing method of the array substrate according to the embodiment of the present invention.

Wherein, as shown in FIG. 3, S13 may specifically comprise:

S131: forming the patterned source-drain layer on the inorganic film set layer.

In the embodiment, the source-drain layer comprises a plurality of spaced-apart wires, and the wires straddle the display region and the non-display region, one end of the wires is connected to the pixel unit arranged in the display region, and the other end of the wires is connected to a driver interface arranged in the non-display region.

Specifically, S131 may comprise: the source-drain material layer is laid on the inorganic film set layer by a physical vapor deposition process, and then the source-drain material layer is patterned by an exposure and etching process to obtain the patterned source-drain layer. A material of the source-drain layer may be a metal material such as aluminum, copper or silver.

S132: forming the opening in a region of the inorganic film set layer not covered by the source-drain layer, wherein the opening is disposed in the non-display region.

In the embodiment, the non-display region comprises a bending zone and a non-bending zone disposed at a side of the bending zone. Specifically, the array substrate can be bent in the bending zone to fold the driver interface arranged in the non-bending zone to the non-light emitting surface of the array substrate, thereby achieving narrow frame of the display panel.

Further, in order to improve the bending performance of the bending zone, the inorganic film set layer disposed on the bending zone may be etched and punctured. For example, S132 may specifically comprise: etching a predetermined position of the inorganic film set layer disposed on the bending zone to form the opening, wherein the predetermined position is arranged in a zone where the inorganic film set layer is not covered by the source-drain layer.

In some embodiments, the number of openings may be multiple, and the plurality of openings may be evenly distributed on the bending zone or distributed in an array to ensure the flexibility of the bending zone.

In the embodiment, the opening can be a groove or a through hole. When the opening is a through hole, the opening may comprise a first hole and a second hole that are stacked and communicated with each other on the base. The first hole and the second hole are formed by two etching processes to reduce a thickness of a photoresist to be coated in a single etching process, thereby reducing the energy consumption of the exposure machine in a single etching process, and thereby reducing equipment costs. Specifically, S132 may comprise:

Sub-step D: forming the first hole having a first predetermined depth on the inorganic film set layer by exposure and etching.

The first predetermined depth may be 0.3 to 0.5 of the thickness of the inorganic film set layer. For example, if the thickness of the inorganic film set layer is 1.5 μm, the first predetermined depth may be 0.45 to 0.75 μm.

Specifically, the sub-step D may specifically comprise: coating the photoresist having a first predetermined thickness on the inorganic film set layer; exposing, developing, and etching the photoresist-coated inorganic film set layer to form the first hole having the first predetermined depth. Wherein the first predetermined depth is equal to a value corresponding to the first predetermined thickness.

Sub-step E: forming the second hole having a second predetermined depth on the inorganic film set layer in a direction close to the base and through the first hole by exposure and etching. A sum of the second predetermined depth and the first predetermined depth is equal to a thickness of the inorganic film set layer.

Wherein the second predetermined depth is equal to the difference between the thickness of the inorganic film set layer and the first predetermined depth. For example, the inorganic film set layer has the thickness of 1.5 μm, and the first predetermined depth is 0.45 to 0.75 μm, and the second predetermined depth may be 0.75 to 1.05 μm.

Specifically, sub-step E may specifically comprise: coating the photoresist having a second predetermined thickness on the inorganic film set layer formed with the first hole; and exposing, developing, and etching the photoresist-coated inorganic film set layer to form the second hole having the second predetermined depth. Wherein the second predetermined depth is equal to the value corresponding to the second predetermined thickness.

It should be noted that in some embodiments, the opening may be formed on the inorganic film set layer, and then the patterned source-d drain layer may be formed on the inorganic film set layer. That is, S13 may specifically comprise: forming the opening on the non-display region of the inorganic film set layer; and forming the patterned source-drain layer on a region other than the opening of the inorganic film set layer. For the specific implementation, reference may be made to the above sub-step D and sub-step E, and therefore no further details are provided herein.

S14: forming an organic planarization layer on the inorganic film set layer. The organic planarization layer covers the source-drain layer and fills and covers the opening.

For example, a chemical vapor deposition process is used to deposit the organic planarization layer on the inorganic film layer. A material of the organic planarization layer may be an organic insulating material such as a polyimide resin, an epoxy resin, or an acrylic resin.

Different from the prior art, the manufacturing method of the array substrate in the embodiment, by making the opening on the inorganic film set layer disposed in the non-display region, and filling the opening in the subsequent planarization layer manufacturing process, which can reduce processes of filling the opening with organic material, saves masks of the processes, and helps to reduce costs.

Figure 4:
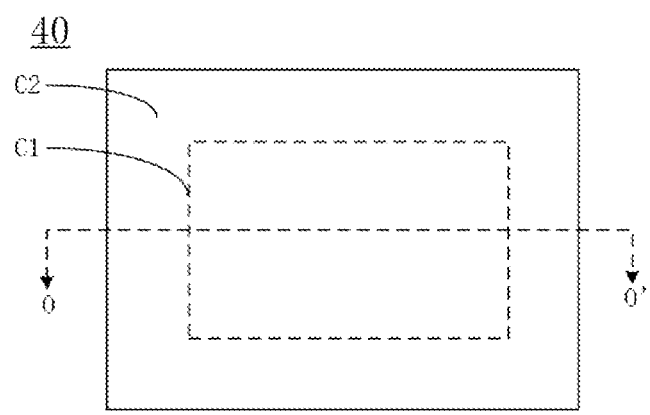
FIG. 4 is a schematic top plan view of the array substrate according to the embodiment of the present invention.
Figure 5:
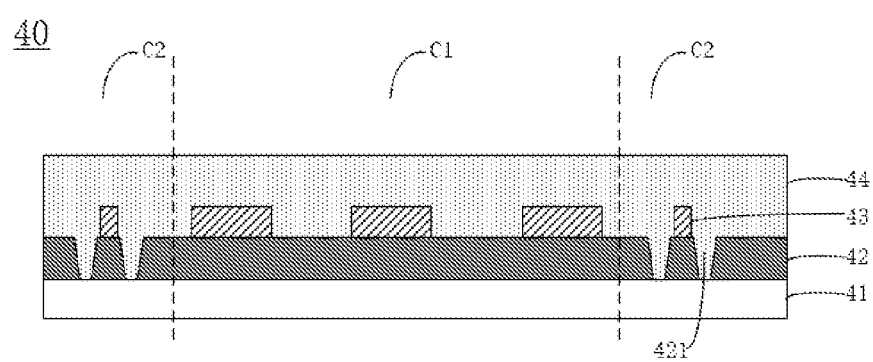
FIG. 5 is a schematic cross-sectional view taken along a line O-O' in FIG. 4.

Please refer to FIG. 4 and FIG. 5. FIG. 4 is a schematic top plan view of the array substrate according to the embodiment of the present invention, and FIG. 5 is a schematic cross-sectional view taken along a line O-O' in FIG. 4. As shown in FIG. 4 and FIG. 5, the array substrate 40 comprises a substrate 41, an inorganic film set layer 42, a patterned source-drain layer 43, and an organic planarization layer 44 which are sequentially disposed on the substrate 41. The base 41 comprises a display region C1 and a non-display region C2 disposed around the display region C1. An opening 421 is provided on the inorganic film set layer 42, and the opening 421 is disposed in the non-display region C2. The source-drain layer 43 does not cover or fill the opening 421. The organic planarization layer 44 covers the source-drain layer 43 and fills and covers the opening 421.

The substrate 41 is a flexible substrate, and a material thereof may be one of organic polymers such as polyimide, polycarbonate, polyethylene terephthalate, and polyethersulfone substrate. A material of the organic planarization layer 44 may be an organic insulating material such as a polyimide resin, an epoxy resin, or an acrylic resin.

Figure 6:
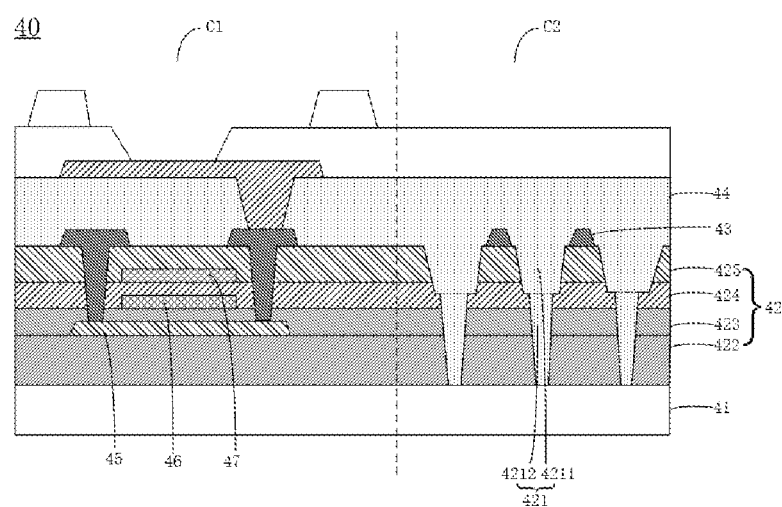
FIG. 6 is another schematic structural view of the array substrate provided by the embodiment of the present invention.

Specifically, as shown in FIG. 6, the inorganic film set layer 42 may comprise a buffer layer 422, a first gate insulating layer 423, a second gate insulating layer 424, and an interlayer dielectric layer 425 which are sequentially away from the substrate 41. A material of the buffer layer 422 may be SiNx, SiOx or other suitable materials. A material of the first gate insulating layer 423 may be SiOx. A material of the second gate insulating layer 424 may be SiNx. A material of the interlayer dielectric layer 424 may be one or two of SiNx and SiOx.

Referring to FIG. 6, the array substrate 40 may further comprise a low temperature polysilicon layer 45, a first metal layer 46, and a second metal layer 47 which are sequentially away from the substrate 41. The low temperature polysilicon layer 45, the first metal layer 46, and the second metal layer 47 are all disposed in the display region. The low temperature counter crystal silicon layer 45 is disposed between the buffer layer 422 and the first gate insulating layer 423. The first metal layer 46 is disposed between the first gate insulating layer 423 and the second gate insulating layer 424. The second metal layer 47 is disposed between the second gate insulating layer 424 and the interlayer dielectric layer 425. Specifically, the first metal layer 46 may be a patterned gate layer. The first metal layer 46 comprises a gate of the thin film transistor in the array substrate 40, and a lower electrode of a storage capacitor. The second metal layer 47 may comprise an upper electrode of the storage capacitor in the array substrate 40, and the upper electrode and the lower electrode of the first metal layer 46 together constitute a storage capacitor in the array substrate 40.

In the embodiment, the patterned source-drain layer 43 may comprise a plurality of spaced-apart wires, and the wires straddle the display region C1 and the non-display region C2. One end of the wires is connected to a pixel unit (not shown) disposed in the display region C1, and the other end of the wires is connected to a driver interface (not shown) disposed in the non-display region C2. A material of the source-drain layer 43 may be a metal material such as aluminum, copper or silver.

Figure 7:
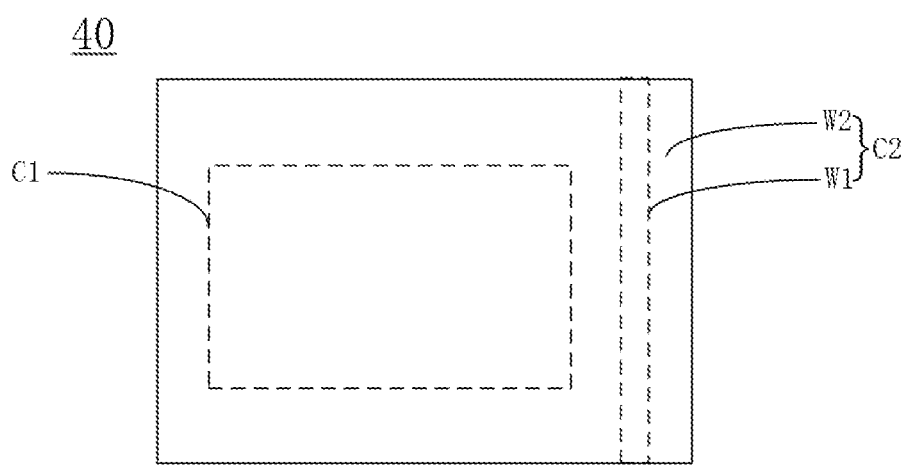
FIG. 7 is another schematic structural view of the array substrate provided by the embodiment of the present invention.

Specifically, as shown in FIG. 7, the non-display region C2 may comprise a bending zone W1 and a non-bending zone W2 disposed at a side of the bending zone W1. Specifically, the array substrate 40 can be bent at the bending zone W1 to fold the driver interface (not shown) disposed in the non-bending zone W2 to the non-light emitting surface of the array substrate 40, thereby achieving a narrow frame of the display panel.

Figure 8:
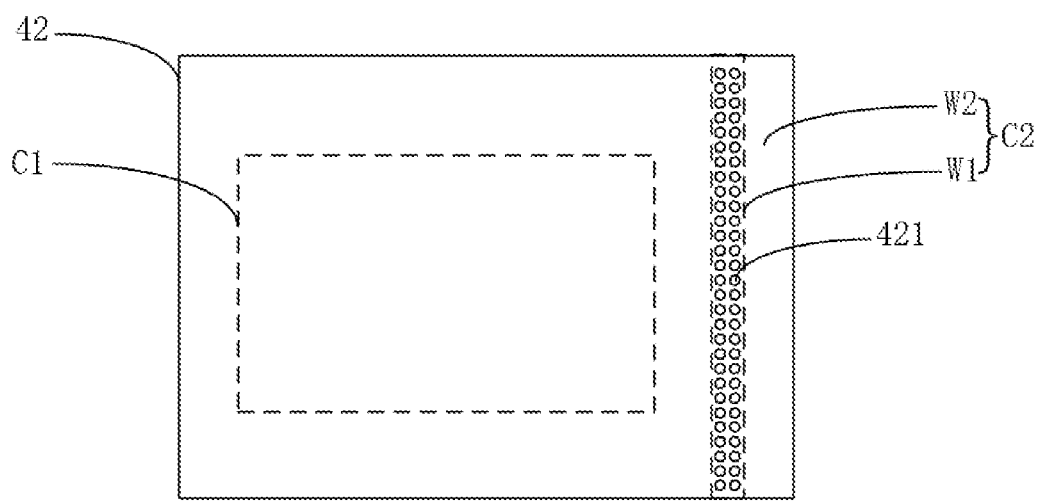
FIG. 8 is a schematic view showing a structure of an inorganic film set layer in FIG. 7.

Further, as shown in FIG. 8, in order to improve the bending property of the bending zone W1, the inorganic film set layer 42 disposed on the bending zone W1 may be etched to form an opening 421 in a zone where the inorganic film set layer 42 is not covered by the source-drain layer. Specifically, the number of the openings 421 may be multiple, and the plurality of openings 421 may be evenly distributed on the bending zone W1 or distributed in an array to ensure the flexibility of the bending zone W1.

In the embodiment, the opening 421 can be a groove or a through hole. Please continue to refer to FIG. 6, when the opening 421 is a through hole, the opening 421 may comprise a first hole 4211 and a second hole 4212 that are stacked and communicated with each other on the base 41. The first hole 4211 and the second hole 4212 are formed by two etching processes to reduce a thickness of a photoresist to be coated in a single etching process, thereby reducing the energy consumption of the exposure machine in a single etching process, and thereby reducing equipment costs.

Specifically, the first hole 4211 is disposed on the second hole 4212. A depth of the first hole 4211 may be 0.3 to 0.5 of a thickness of the inorganic film set layer 42. For example, if the thickness of the inorganic film set layer is 1.5 µm, the depth of the first hole 4211 may be 0.45 to 0.75 µm. A depth of the second hole 4212 is equal to a difference between the thickness of the inorganic film set layer 42 and the depth of the first hole 4211. For example, the thickness of the inorganic film set layer 42 is 1.5 µm, and the depth of the first hole 4211 is 0.45 to 0.75 µm, and the depth of the second hole 4212 may be 0.75 to 1.05 µm.

Different from the prior art, the array substrate in the embodiment, by making the opening on the inorganic film set layer disposed in the non-display region, and filling the opening in the subsequent planarization layer manufacturing process, which can reduce processes of filling the opening with organic material, saves masks of the processes, and helps to reduce costs.

Figure 9:
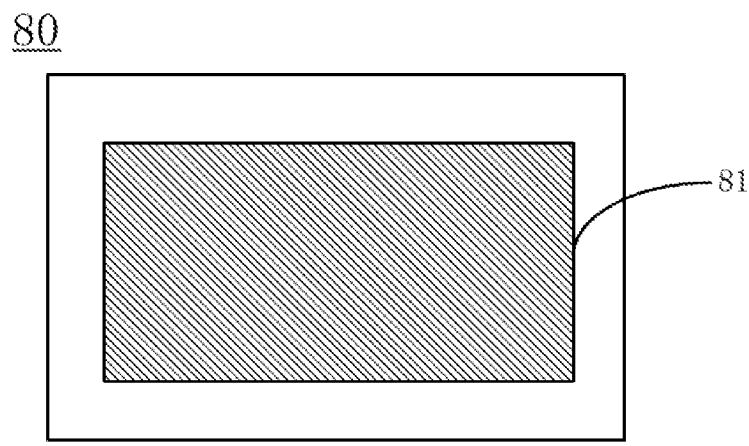
FIG. 9 is a schematic structural view of a display panel according to the embodiment of the present invention.

Please refer to FIG. 9. FIG. 9 is a schematic structural view of a display panel according to the embodiment of the present invention. As shown in FIG. 9, the display panel 80 comprises the array substrate 81 of any of the above embodiments.

Wherein, the array substrate 81 comprises a substrate, an inorganic film set layer, a patterned source-drain layer, and an organic planarization layer which are sequentially disposed on the substrate. The base comprises a display region and a non-display region disposed around the display region. An opening is provided on the inorganic film set layer, and the opening is disposed in the non-display region. The source-drain layer does not cover or fill the opening. The organic planarization layer covers the source-drain layer and fills and covers the opening.

Different from the prior art, the display panel in the embodiment, by making the opening on the inorganic film set layer disposed in the non-display region, and filling the opening in the subsequent planarization layer manufacturing process, which can reduce processes of filling the opening with organic material, saves masks of the processes, and helps to reduce costs In the above, various other corresponding changes and modifications can be made according to the technical solutions and technical ideas of the present invention to those skilled in the art, and all such changes and modifications are within the scope of the claims of the present invention.

What is claimed is:

1. A manufacturing method of an array substrate, comprising following steps of:
    providing a base, wherein the base comprises a display region and a non-display region disposed around the display region;
    forming an inorganic film set layer on the base; wherein the inorganic film set layer comprises a buffer layer, a first gate insulating layer, a second gate insulating layer, and an interlayer dielectric layer sequentially away from the base, and the step of forming the inorganic film set layer on the base comprises: depositing the buffer layer on the base; depositing the first gate insulating layer on the buffer layer; depositing the second gate insulating layer on the first gate insulating layer; and depositing the interlayer dielectric layer on the second gate insulating layer;
    forming an opening in the inorganic film set layer and forming a patterned source-drain layer, wherein the opening is disposed in the non-display region, and the patterned source-drain layer does not cover or fill the opening; and
    forming an organic planarization layer on the inorganic film set layer, wherein the organic planarization layer covers the patterned source-drain layer and fills and covers the opening;
    wherein the non-display region comprises a bending zone and a non-bending zone disposed at a side of the bending zone, and wherein the opening is plural and arranged in an array in the bending zone.

2. The manufacturing method as claimed in claim 1, wherein the step of forming the opening in the inorganic film set layer and forming the patterned source-drain layer comprises:
    forming the patterned source-drain layer on the inorganic film set layer; and
    forming the opening in a region of the inorganic film set layer not covered by the patterned source-drain layer, wherein the opening is disposed in the non-display region.

3. The manufacturing method as claimed in claim 1, wherein the opening comprises a first hole and a second hole that are stacked and communicated with each other on the base, and the step of forming the opening in the inorganic film set layer comprises:
    forming the first hole having a first predetermined depth on the inorganic film set layer by exposure and etching; and
    forming the second hole having a second predetermined depth on the inorganic film set layer in a direction close to the base and through the first hole by exposure and etching, wherein a sum of the second predetermined depth and the first predetermined depth is equal to a thickness of the inorganic film set layer.

4. The manufacturing method as claimed in claim 1, further comprising:
    forming a low temperature polysilicon layer on the buffer layer after the step of depositing the buffer layer on the base, wherein the low temperature polysilicon layer is disposed in the display region, and the first gate insulating layer covers the low temperature polysilicon layer;
    forming a first metal layer on the first gate insulating layer after the step of depositing the first gate insulating layer on the buffer layer, wherein the first metal layer is disposed in the display region, and the second gate insulating layer covers the first metal layer; and
    forming a second metal layer on the second gate insulating layer after the step of depositing the second gate insulating layer on the first gate insulating layer, wherein the second metal layer is disposed in the display region, and the interlayer dielectric layer covers the second metal layer.

5. An array substrate, comprising:
    a base, wherein the base comprises a display region and a non-display region disposed around the display region;
    an inorganic film set layer disposed on the base, wherein the inorganic film set layer comprises a buffer layer, a first gate insulating layer, a second gate insulating layer, and an interlayer dielectric layer sequentially away from the base, wherein an opening is provided in the inorganic film set layer, and the opening is disposed in the non-display region;
    a patterned source-drain layer disposed on the inorganic film set layer, wherein the patterned source-drain layer does not cover or fill the opening; and
    an organic planarization layer disposed on the inorganic film set layer, wherein the organic planarization layer covers the patterned source-drain layer and fills and covers the opening;
    wherein the non-display region comprises a bending zone and a non-bending zone disposed at a side of the bending zone, and wherein the opening is plural and arranged in an array in the bending zone.

6. The array substrate as claimed in claim 5, wherein the opening is a groove or a through hole.

7. The array substrate as claimed in claim 5, wherein the opening comprises a first hole and a second hole that are stacked and communicated with each other on the base.

8. The array substrate as claimed in claim 7, wherein the first hole is disposed on the second hole, and a ratio of a depth of the first hole to a thickness of the inorganic film set layer is in a range from 0.3 to 0.5.

9. A display panel, comprising an array substrate, wherein the array substrate comprises:
    a base, wherein the base comprises a display region and a non-display region disposed around the display region;
    an inorganic film set layer disposed on the base, wherein the inorganic film set layer comprises a buffer layer, a first gate insulating layer, a second gate insulating layer, and an interlayer dielectric layer sequentially away from the base, wherein an opening is provided in the inorganic film set layer, and the opening is disposed in the non-display region;
    a patterned source-drain layer disposed on the inorganic film set layer, wherein the patterned source-drain layer does not cover or fill the opening; and
    an organic planarization layer disposed on the inorganic film set layer, wherein the organic planarization layer covers the patterned source-drain layer and fills and covers the opening;
    wherein the non-display region comprises a bending zone and a non-bending zone disposed at a side of the bending zone, and wherein the opening is plural and arranged in an array in the bending zone.

10. The display panel as claimed in claim 9, wherein the opening is a groove or a through hole.

11. The display panel as claimed in claim 9, wherein the opening comprises a first hole and a second hole that are stacked and communicated with each other on the base.

12. The display panel as claimed in claim 11, wherein the first hole is disposed on the second hole, and a ratio of a depth of the first hole to a thickness of the inorganic film set layer is in a range from 0.3 to 0.5.

* * * * *